United States Patent [19]

Koen

[11] Patent Number: 4,634,993
[45] Date of Patent: Jan. 6, 1987

[54] HIGH GAIN, LOW DRIFT OPERATIONAL AMPLIFIER FOR SAMPLE AND HOLD CIRCUIT

[75] Inventor: Myron J. Koen, Tucson, Ariz.
[73] Assignee: Burr-Brown Corporation, Tucson, Ariz.
[21] Appl. No.: 768,868
[22] Filed: Aug. 23, 1985
[51] Int. Cl.[4] ............................................... H03F 3/45
[52] U.S. Cl. .................................. 330/253; 330/255; 330/257; 330/258; 330/260; 307/353
[58] Field of Search ............... 330/253, 255, 257, 260, 330/300, 311, 258; 307/353; 328/151

[56] References Cited
FOREIGN PATENT DOCUMENTS
20315  2/1981  Japan .................................... 330/257

Primary Examiner—James B. Mullins
Attorney, Agent, or Firm—Cahill, Sutton & Thomas

[57] ABSTRACT

A sample and hold circuit includes a high gain, low drift closed loop operational amplifier that isolates the sampling capacitor and provides low output impedance, and a low, stable, input offset voltage and very high bandwidth. The operational amplifier includes N-channel FET source followers coupled by balanced bias and level shifting circuitry to an NPN differential amplifier stage. Symmetrical, buffered cross-coupling from each of the source follower FETs to the opposite level shifting circuitry increases the amplification thereof and results in low DC offset voltage, high input impedance, and high gain and bandwidth.

6 Claims, 4 Drawing Figures

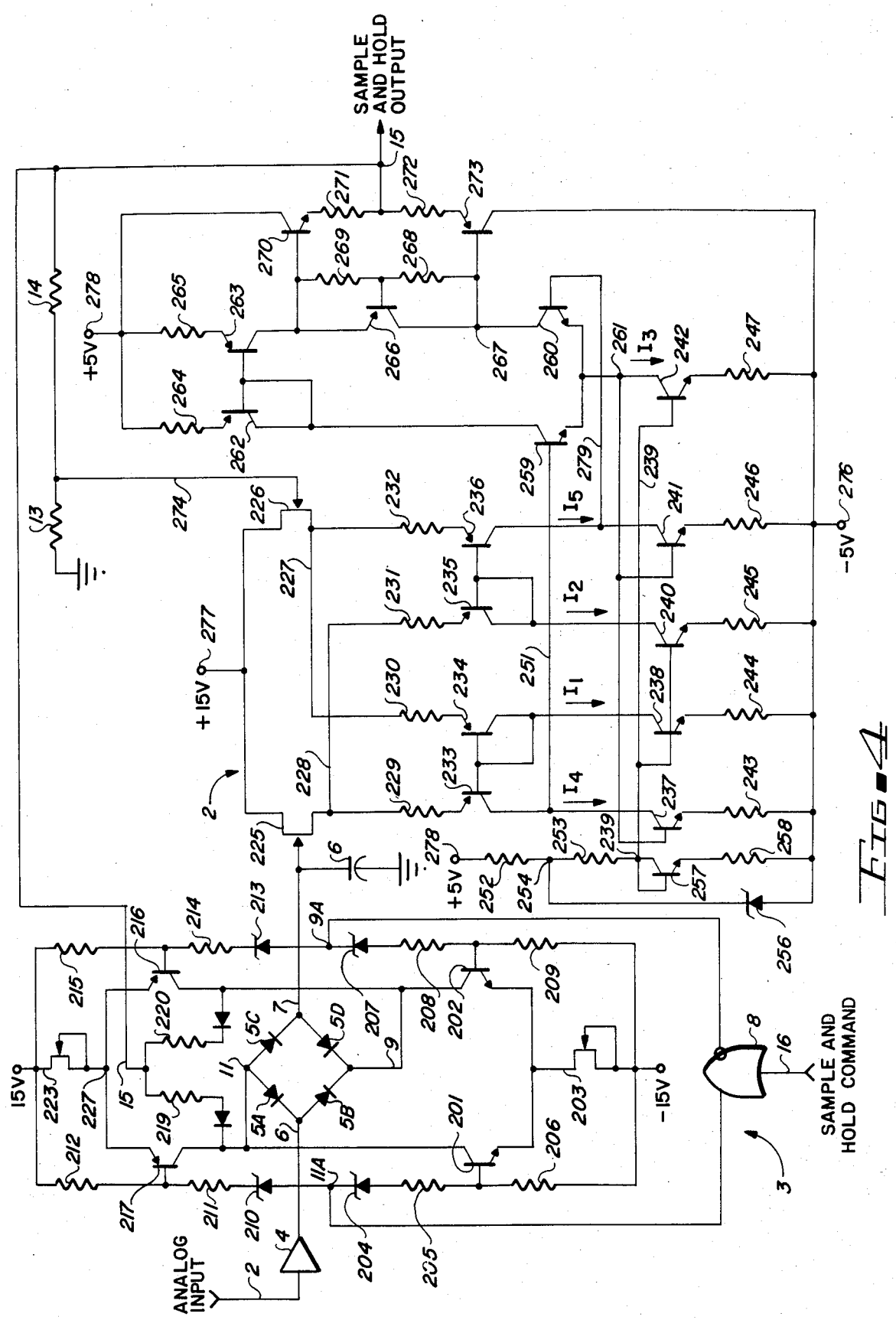

HIGH GAIN, LOW DRIFT OPERATIONAL AMPLIFIER FOR SAMPLE AND HOLD CIRCUIT

BACKGROUND OF THE INVENTION

The invention relates to high gain, low drift operational amplifiers having field effect transistor input stages, especially as used in high speed sample and hold circuits.

A type of analog-to-digital converter (ADC) known as a subranging ADC is one of three common types of high speed ADCs. ADCs of the successive approximation type are simple in structure, and may be very accurate, but they have very slow conversion times, due to the serial nature of the conversion processes therein. For example, for a successive approximation analog-to-digital converter with 12 bits of resolution, conversion times of about 0.6 microseconds to one microsecond are typical. At the other extreme, ADCs of the "flash converter" type have very short conversion times, requiring one cycle of operation. However, the high speed is achieved at the expense of greatly increased circuit complexity. Flash converters with 8 bits of resolution and conversion rates as high as 100 megahertz represent the limits of present integrated circuit technology. ADCs of the subranging type provide an intermediate compromise between flash encoders and successive approximation ADCs. The present state-of-the-art for subranging ADCs is thought to be represented by a 12 bit, 10 megahertz subranging analog-to-digital converter Model No. CAV-1210, manufactured by Analog Devices Corporation. Subranging analog-to-digital converters typically use a sample and hold or track and hold circuit that produces a sample voltage, which is encoded by a MSB (most significant bit) flash encoder to produce an MSB word.

The sample and hold circuits required in subranging analog-to-digital converters must be very accurate. Typically, such sample and hold (or track and hold) circuits include a switching diode sampling bridge that is isolated from the analog input signal by a high speed, highly accurate open loop input buffer. A sampling capacitor is connected to the output of the diode sampling bridge, which is actuated in response to a "sample command", and is applied as an input to a second high speed buffer. Typically, the output impedance of a sample and hold circuit of the type used in subranging analog-to-digital converters, such as the HTS0010 track and hold circuit made by Analog Devices Corporation, is about 5 ohms. The gain of the track and hold circuit is adjusted by an external potentiometer.

Although use of feedback amplifiers to achieve high input impedance and low output impedance is a common expedient, up to now no operational amplifier has been known having the very low input offset voltage, the high degree of temperature stability, the high input impedance, and the high bandwidth that would be needed to allow use of a closed loop output stage for a sample and hold (or track and hold) circuit that would be suitable for a 12 bit, 10 megahertz subranging analog-to-digital converter.

SUMMARY OF THE INVENTION

It is an object of the invention to provide an improved high speed, very high accuracy sample and hold or track and hold circuit.

It is another object of the invention to provide an improved closed loop amplifier of sufficiently high bandwidth, low input offset, and high DC stability that is adequate for use in a sample and hold circuit in a 10 megahertz, 12 bit subranging analog-to-digital converter.

Briefly described, and in accordance with one embodiment thereof, the invention provides a high accuracy sample and hold circuit is provided, utilizing a closed loop output amplifier to function as a high input impedance buffer between a sampling capacitor and the output of a switching diode bridge, the input of which is buffered from an analog input signal to be sampled by means of a high speed buffer circuit. A high speed, high accuracy, low offset, low drift operational amplifier satisfactory for use as a closed loop amplifier. The closed loop amplifier of the described sample and hold circuit includes a pair of N-channel JFET source follower circuits having gate electrodes respectively coupled to the sample and hold circuit output and a feedback resistor connected to the output of the amplifier. A balanced current biasing and input voltage level shifting and amplifying circuit includes first and second source follower circuits, each including, in series connection with the source electrode of the respective one of the N-channel JFETs, a resistor coupled to the emitter of a PNP transistor, the collector of which is coupled to a constant current source. The collectors of the two PNP transistors are respectively connected to the base electrodes of the NPN differential input pair of transistors of a differential amplifier, the output of which is coupled by the feedback resistor to the gate of one of the N-channel JFETs, the gate of the other JFET functioning as a non-inverting input of the closed loop operational amplifier. The source electrode of each of the N channel JFETs is coupled by a buffer circuit to the base electrode of the PNP transistor of the opposite source follower circuit. In the described embodiment of the invention, each buffer circuit includes a resistor connected to the source electrode of one of the N-channel JFETs and also connected to the emitter of a diode-connected PNP transistor, the base of which is connected to the base of the PNP transistor of the opposite source follower circuit and is also connected to a constant current source. Differences between the voltage of the gate electrodes of the two JFETs are translated into increases in the PNP transistors of the source follower circuits, and hence into increases in the differential input voltage applied to the NPN differential amplifier. The transconductance of the dual source follower input circuit with buffered cross-coupling therebetween results in increased transconductance, and hence increased gain of the operational amplifier. The symmetrical construction results in very low input offset voltages and very low thermal drift thereof.

BRIEF DESCRIPTION OF THE DRAWINGS

FIG. 4 is a detailed schematic diagram of the sample and hold circuit contained in the subranging analog-to-digital converter of FIG. 1.

DESCRIPTION OF THE INVENTION

Figure 1:
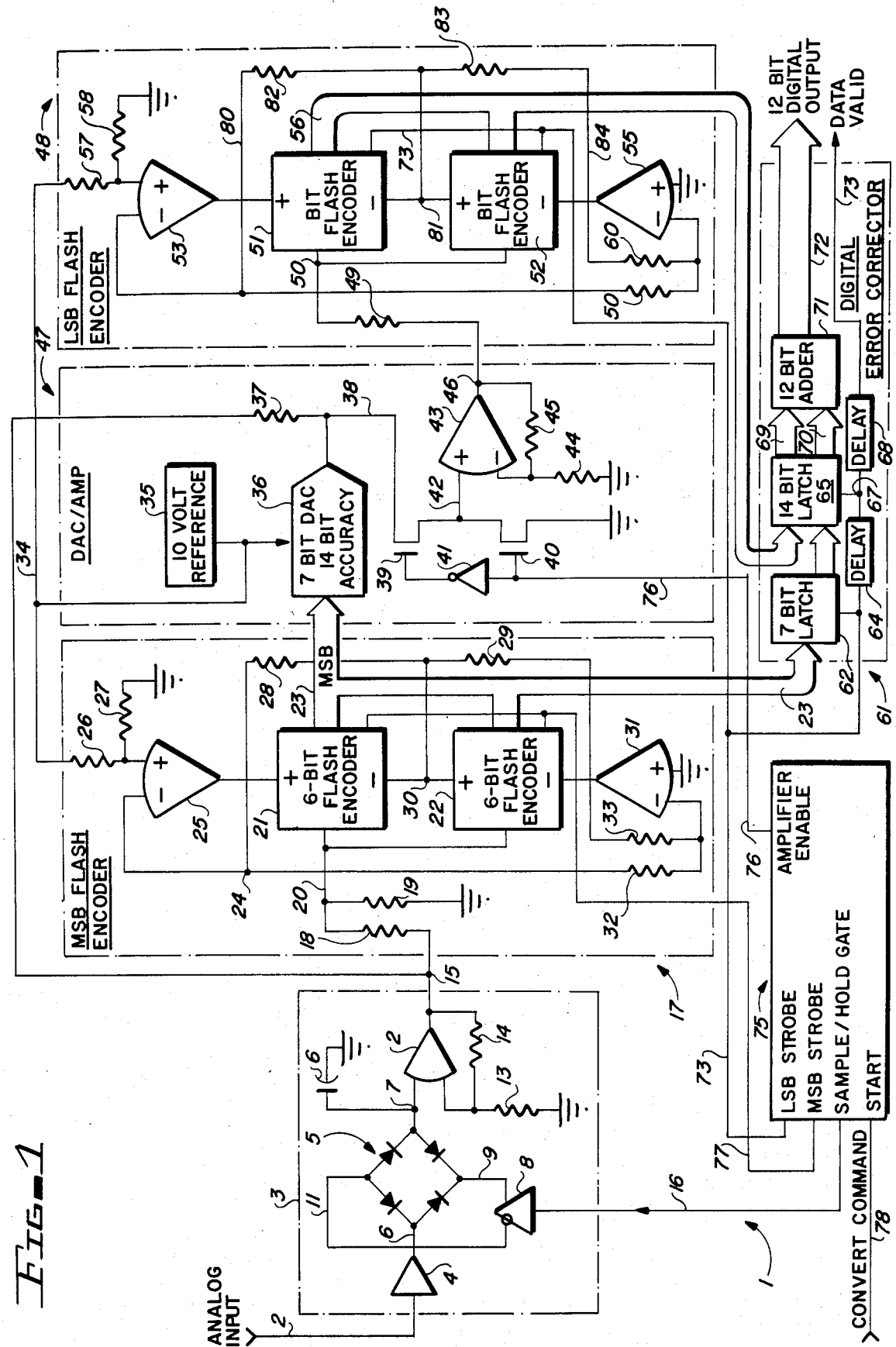
FIG. 1 is a block diagram of the subranging analog-to-digital converter of the present invention.

Referring to FIG. 1, reference numeral 1 designates a subranging "modular" 12 bit analog-to-digital converter (ADC) that is capable of very accurate operation at a 10 megahertz rate. 12 bit ADC 1 includes a sample and hold circuit 3, which samples an analog input signal 2 and precisely applies the sampled analog input to produce a stable "sampled" output voltage on conductor 15. That sampled output voltage is applied to the analog input of a 7 bit flash encoder (i.e., a 7 bit analog-to-digital converter) 17.

Flash encoder 17 is hereinafter referred to as "MSB flash encoder" 17. It produces a 7 bit digital output, in response to an MSB strobe signal produced on conductor 77 by a timing circuit 75. The 7 bit digital output of MSB flash encoder 17 is applied to a 7 bit digital-to-analog converter (DAC) 36 having 14-bit accuracy.

The highly accurate analog signal produced on node 38 by DAC 36 is subtracted from the sampled voltage produced on conductor 15, and the result is amplified by a wide band operational amplifier 43 to produce an analog signal 46 that is applied to the analog input of a second flash encoder 48, hereinafter referred to as LSB flash encoder 48.

The 7 bit output produced by MSB flash encoder 17 and the 7 bit output produced by LSB flash encoder 48 are applied to appropriate inputs of a digital error correcting circuit 61, which combines the two 7 bit outputs to produce a 12 bit digital output 72 that precisely represents the value of the sampled analog input signal.

Sample and hold circuit 3 includes an input buffer 4, the output of which is applied to a conventional diode bridge switching circuit 5. Input buffer 4 can be any suitable high speed open loop buffer circuit, such as a HA-5033, by Harris Semiconductor, Inc. Diode bridge switching circuit 5 couples four hot carrier diodes 5A, 5B, 5C, and 5D (see FIG. 4) between conductors 6, 9, 7, and 11 in the manner shown. A sample and hold gate strobe signal is applied by means of conductor 16 to the input of an inverter/buffer circuit 8, the inverting and non-inverting outputs of which are connected to conductors 9 and 11, respectively.

Output node 7 of diode bridge switching circuit 5 is connected to one terminal of a 40 picofarad sampling capacitor 6, the other terminal of which is connected to ground. Conductor 7 of switching diode bridge circuit 5 is connected to the non-inverting input of a very accurate, high gain, high bandwidth operational amplifier 2, the output of which is connected to conductor 15. Conductor 15 is coupled by feedback resistor 14 to the inverting input of operational amplifier 2. That inverting input also is connected by resistor 13 to ground.

In accordance with one aspect of the present invention, sample and hold circuit 3 includes the combination of a closed loop amplifier 2 with the conventional diode switching bridge structure 5. Ordinarily, open loop buffers, rather than closed loop operational amplifiers, are provided to buffer the sampling capacitor from the output of a sample and hold circuit, if very precise sampling of an analog input is required. This is because no sufficiently accurate, stable, high speed, high bandwidth, high input impedance operational amplifier has been heretofore available. The detailed structure of sample and hold circuit 3 and operational amplifier 2 is shown in FIG. 4, and is subsequently described.

MSB flash encoder 17 includes two 6 bit flash encoder circuits 21 and 22, each of which can be a Siemens SDA5200 flash encoder. Analog inputs of each of 6 bit flash encoders 21 are connected by conductor 20 to 100 ohm resistors 18 and 19. The opposite terminal of resistor 19 21 is connected to ground, and the opposite terminal of resistor 18 is connected to conductor 15.

The positive reference input of 6 bit flash encoder 21 is connected by conductor 24 to the output of an ordinary operational amplifier 25. The positive input of operational amplifier 25 is connected to one terminal of each of resistors 26 and 27. The opposite terminal of resistor 27 is connected to ground. The opposite terminal of resistor 26 is connected to a 10 volt reference voltage on conductor 34, produced by 10 volt reference circuit 35. The negative input of operational amplifier 25 is connected to conductor 24. The negative reference input of 6 bit flash encoder circuit 21 is connected by conductor 30 to the positive reference voltage input of 6 bit flash encoder 22. The negative reference input of 6 bit flash encoder 22 is connected by conductor 31A to the output of an ordinary operational amplifier 31, the positive input of which is connected to ground. The negative input of operational amplifier 31 is connected by resistor 33 to output conductor 31A. Operational amplifier 25 reduces the 10 volt reference voltage produced on conductor 34 by 10 volt reference circuit 35 to about +0.625 volts, which is applied to the positive reference input of 6 bit flash encoder 21. Operational amplifier 31 inverts this +0.625 volt reference voltage to produce reference voltage of about −0.625 volts that is applied to the negative reference input of 6 bit flash encoder 22. The negative input of operational amplifier 31 also is connected by resistor 32 to conductor 24.

In accordance with the present invention, an error adjustment resistor 28 is connected between conductor 24 and conductor 30. A second error adjustment resistor 29 is connected between conductors 30 and 31A. The purpose of the error adjustment resistors 28 and 29, in combination with resistors 26, 27, 32, and 33, is to superimpose a positive error signal on the output reference voltage levels produced by operational amplifiers 25 and 31 and on conductor 30 in order to avoid the need for digital error correcting circuit 75 to process negative digital numbers. This matter will be described subsequently in more detail.

Figure 3:
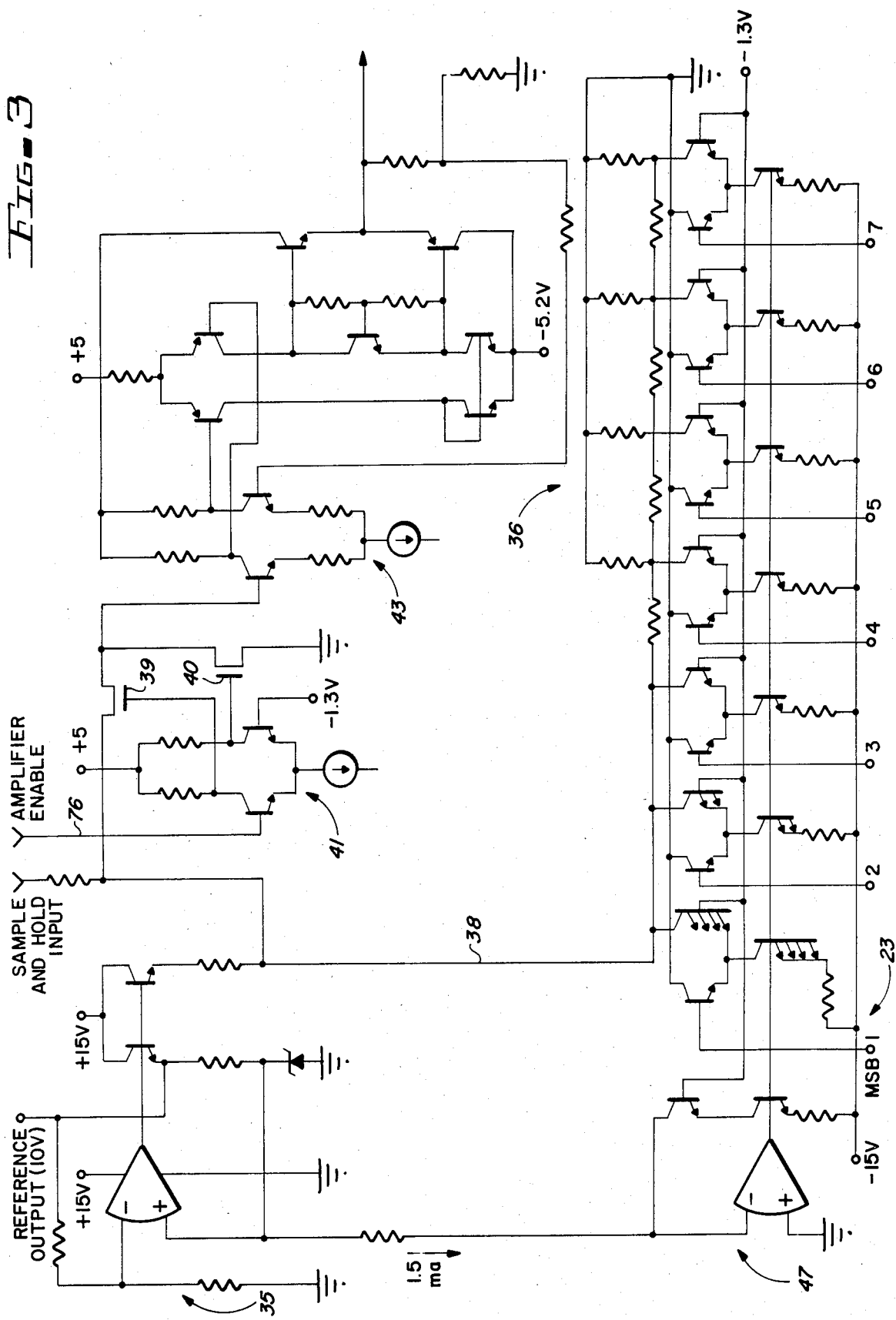
FIG. 3 is a circuit schematic diagram of a portion of the subranging analog-to-digital converter of FIG. 1.

The output of 7 bit DAC 36, the circuitry of which is shown in FIG. 3, is connected by subtraction node 38 and 200 ohm resistor 37 to sample and hold output conductor 15. (The term "summing node" or "summing conductor" is used herein interchangeably with the term "subtraction node", as algebraic summing, which can include subtraction, is what is being referred to.) Subtraction node 38 is also connected to the drain of MOS field effect transistor (MOSFET) 39. The gate of MOSFET 39 is connected to the output of inverting buffer 41, the input of which is connected to the gate of MOS field effect transistor 40. The source of MOSFET 40 is connected to ground. The drain of MOSFET 40 is connected to the source of MOSFET 39 and to conductor 42. Conductor 42 is connected to the positive input of wide band operational amplifier 43, the output of which is connected to conductor 46. The negative input of operational amplifier 43 is connected by feedback resistor 45 to conductor 46 and is also connected by resistor 44 to ground. Amplifier 43 produces a gain of 32.

The input of inverting buffer 41 is connected to Amplifier Enable signal 76, which is produced by timing circuit 75. Amplifier Enable signal 76 is shown by waveform 76 in FIG. 2. The Sample and Hold Strobe signal produced on conductor 16 is shown by waveform 16 in FIG. 2 The MSB Strobe signal applied to the strobe inputs of 6 bit flash encoders 21 and 22, produced on conductor 77 by timing circuit 75 in response to convert command 78, is shown by waveform 77 in FIG. 2. The Convert Command waveform is shown by waveform 78 in FIG. 2. The output of a typical one of the seven conductors 23 produced by MSB flash encoder 17 is shown by the MSB Data waveform 23 in FIG. 2.

The amplified output signal 46 produced by operational amplifier 43 is applied to the analog inputs of 6 bit flash encoders 51 and 52 of LSB flash encoder 48, by means of resistor 49 and conductor 50. 6 bit flash encoders 51 and 52 are identical to previously described 6 bit flash encoders 21 and 22, and are connected in precisely the same manner. Similarly, operational amplifiers 53 and 55 produce approximately +0.625 volt and approximately −0.625 volt reference voltages at the positive reference input of 6 bit flash encoder 51 and the negative reference input of flash encoder 52, essentially as in MSB flash encoder 17. The negative reference input of flash encoder 52 is connected by conductor 81 to the positive reference input of flash encoder 52. Error adjustment resistor 82 is connected between output conductor 80 of operational amplifier 53 and conductor 81. Error adjustment resistor 83 is connected between conductor 81 and the output of operational amplifier 55. Adjustment resistors 82 and 83 and resistors 57, 58, 59, and 60 are adjusted in order to precisely adjust the voltages on conductors 80, 81, and 84 so as to produce all ones at the 7 bit output 56, when +0.625 volts is applied to conductor 50, all zeros when −0.625 volts is applied to conductor 50, and a suitable intermediate voltage, with one bit being a "one" and the rest being "zeros" when 0 volts is applied to conductor 50.

The LSB strobe signal produced on conductor 73 by timing circuit 75 in response to convert command 78 is applied to the strobe inputs of flash encoder circuits 51 and 52. The LSB Data signal 56 in FIG. 2 shows a typical waveform on one of the conductors of LSB bus 56 generated at the output of LSB flash encoder 48 in response to the LSB Strobe signal on conductor 73.

In FIG. 1, digital error correcting circuit 61 includes a 7 bit latch 62, the inputs of which are connected to the seven respective MSB conductors 23. The outputs of 7 bit latch circuit 62 are connected by seven conductors 63 to the 7 most significant bits of a 14 bit latch 65. Conductors 56, connected to the outputs of LSB flash encoder 48, are connected to the 7 least most significant bits of 14 bit latch 65. The corresponding 7 least significant output bits 69 of 14 bit latch 65 are connected to the 7 least significant bit inputs of a 12 bit binary adder. The 7 most significant bits 70 of 14 bit latch 65 each are connected, respectively, to one input of each of the 7 most significant bit pairs of inputs of 12 bit adder 71. The 2 most significant bits of bus 69 and the 2 least significant bits of bus 70 thus "overlap", i.e., are connected to inputs of the same two bits (i.e., bits 6 and 7) of 12 bit adder circuit 71.

The LSB Strobe signal on conductor 73 is delayed 30 nanoseconds by delay element 64, to produce a delayed Register Strobe signal on conductor 67, which is applied to the strobe input of 14 bit latch 65. The Register Strobe signal on conductor 67 is further delayed 44 nanoseconds by delay circuit 68 to produce the Data Valid signal on conductor 74, shown by waveform 74 in FIG. 2. The Register Strobe signal is shown by waveform 67 in FIG. 2, and is used for the purpose of storing data in the 14 bit latch 65. The data produced on a typical conductor of 12 bit digital output bus 72 is designated by Output Data waveform 72 in FIG. 2. The Amplifier Enable 76 produced in response to Convert Command 78 is indicated by waveform 76 of FIG. 2.

Figure 2:
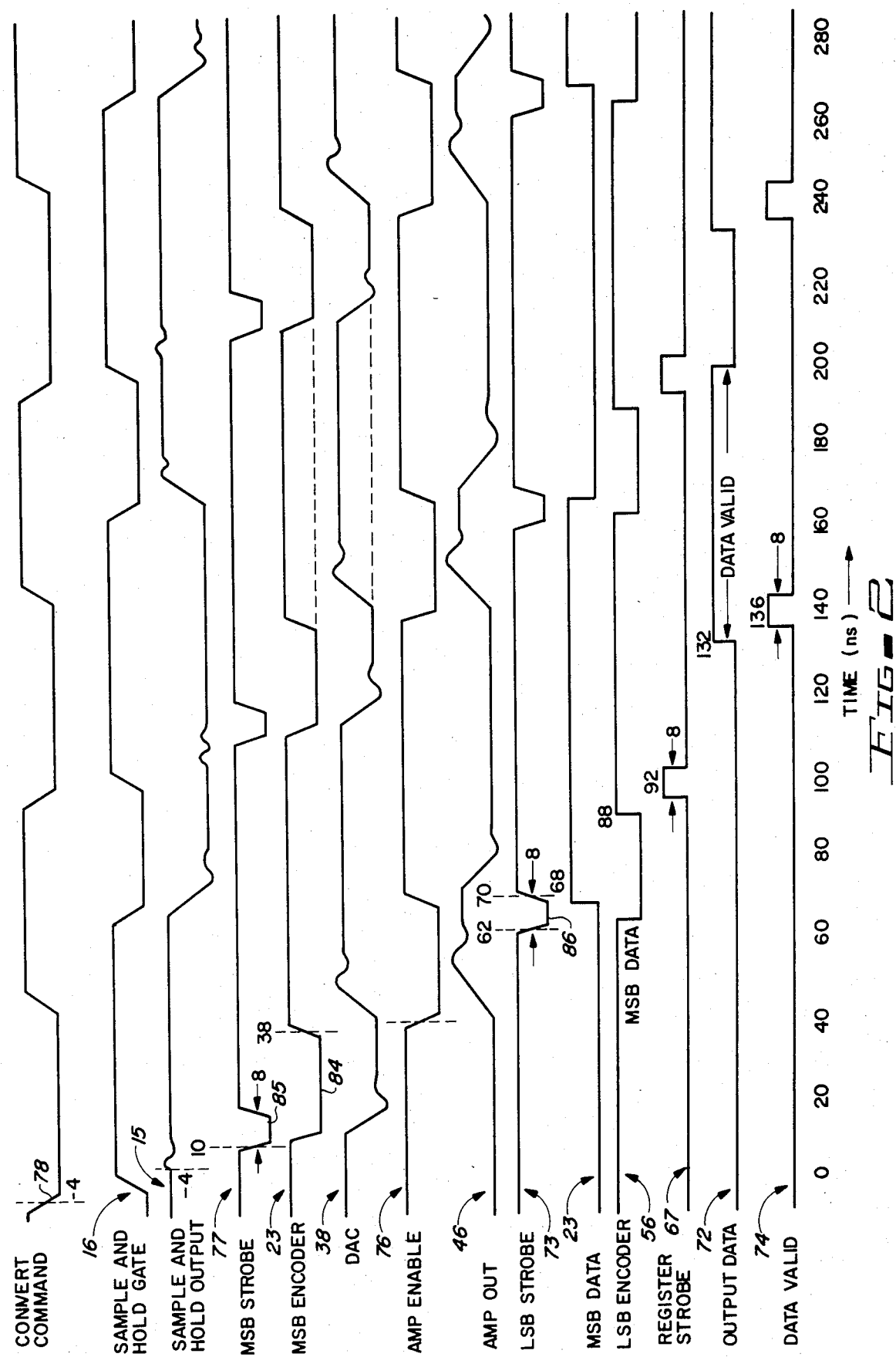
FIG. 2 is a diagram illustrating the various waveforms that occur during operation of the circuit of FIG. 1.

Briefly, the Convert Command 78 causes the timing circuit 75 to produce the Sample and Hold Strobe pulse 16, as indicated by waveforms 78 and 16 in FIG. 2. The value of the analog input voltage 2 to be converted is very precisely held on conductor 15, as shown by Sample and Hold Output waveform 15 in FIG. 2. After a delay of about 38 nanoseconds, pulses such as 84 of waveform 23 are produced on various conductors of MSB bus 23 by the MSB flash encoder 17. The 7 bits 23 produced by 7 bit MSB flash encoder 17 eventually are used in producing the 7 most significant bits of the 12 bit binary output produced on output bus 72. Simultaneously, the sampled analog signal level on conductor 15 is fed forward through 200 ohm resistor 37 to subtraction node 38. The 7 MSB word bits 23 are temporarily loaded into 7 bit latch 62 of digital error correcting circuit 61, and also are applied to the inputs of 7 bit DAC 36, which, as previously mentioned, has 14 bit accuracy. 7 bit DAC 36 is quite similar to a Burr-Brown Model DAC63; its configuration is shown in detail in FIG. 3, subsequently described. The analog output of 7 bit DAC 36 is shown by the DAC waveform 38 in FIG. 2.

It can be seen that two analog signals, including the output waveform 38 of 7 bit DAC 36, which is an analog signal that very accurately represents the 7 bits output of the MSB flash encoder 17, and an extremely precise replica of the original sampled voltage on conductor 15, are applied to subtraction node 38. Usually, there will be a voltage difference between these two signals. This voltage difference is referred to as the difference signal or "residue".

In accordance with the present invention, the residue or difference signal is very accurate, because DAC 36 has 14 bit accuracy, and the sampled voltage 15 fed forward to subtraction conductor 38 is very accurate. Thus, it can be seen that the residue is a very accurate, low amplitude, analog representation of the 5 least significant bits of the desired 12 bit digital output representation of the original analog input signal 2.

In accordance with an important aspect of the present invention, N-channel MOSFETs 39 and 40 isolate the input of wide band amplifier 43 from subtration node 38 by turning MOSFET 39 off and turning MOSFET 40 on, and thereby connecting the positive input of amplifier 43 to ground, until the above-mentioned conversion by 7 bit DAC 36 is complete. This prevents any difference produced on subtraction node 38 during the sample and hold process from overdriving, and possibly saturating, wide band operational amplifier 43.

It is highly desirable to avoid saturating wide band operational amplifier 43. This is true because this settling time of operational amplifier 43 would have to be included in the overall analog-to-digital conversion time of ADC 1.

Further in accordance with the present invention, the elimination of the feed forward delay circuitry used in the prior art Model CAV-1210 A/D converter produced by Analog Devices Corporation provides the benefit of greatly increasing the accuracy and overall reliability of the 12 bit, 10 megahertz analog-to-digital converter of the present invention, and greatly reduces the cost thereof by (1) preventing any distortion in the value of the sampled analog voltage on conductor 15 when the sampled analog voltage is transmitted forward to subtraction node 38, and (2) avoiding the high cost of the feed forward delay circuitry therein. As previously mentioned, most prior subranging high speed, high accuracy analog-to-digital converters utilize a feed forward delay line between the sample and hold circuit output and the subtraction node to avoid overdriving the residue amplifier circuit.

The Amplifier Enable signal 76 turns on MOSFET 39 and turns off MOSFET 40 after 7 bit DAC 36 has completed its conversion, thereby applying the residue signal to the non-inverting input of wide band amplifier 43. Wide band amplifier 43 then amplifies the residue or difference signal by a gain factor of 32. The resulting output signal 46 is shown by waveform 46 in FIG. 2. The Amplifier Enable signal 76 is represented by waveform 76 in FIG. 2.

After 30 nanoseconds has been allowed for the settling of the wide band amplifier output signal 46, the LSB strobe signal 73 is produced by timing circuit 75, causing LSB flash encoder 48 to convert the very accurate amplified residue signal into a 7 bit LSB word on bus 56. This 7 bit LSB word is loaded into the least significant 7 bits of 14 bit latch circuit 65. The 7 bit MSB word stored in latch 62 also is loaded into the 7 most significant bits of 14 bit latch 65.

12 bit adder 71 then simply adds the thus "overlapped" 7 bit MSB word and the 7 bit LSB word together to produce an accurate 12 bit output word on bus 72.

In accordance with the present invention, resistors 26, 27, 28, 29, 32, and 33 are adjusted to add +39 millivolts to the outputs of operational amplifiers 25 and 31 of MSB flash encoder 17. Otherwise, the above-mentioned +0.625 volts would be applied positive reference input of flash encoder 21 and −0.625 millivolts would be applied to the negative reference input of flash encoder 22. This error voltage addition is performed, by laser the foregoing resistors 28 and 29, to ensure that any error introduced by MSB flash encoder 17 falls in a positive, rather than a negative, voltage range, so that the positive error can be cancelled out by an adding operation, which is performed by 12 bit adder 71. Resistors 26 and 27 are laser trimmed to produce a voltage equal to the sum of +0.625 volts and +0.039 volts to the positive reference voltage input of 6 bit flash encoder 21. Resistors 32 and 33 are laser trimmed to cause operational amplifier 31 to produce a voltage equal to the sum of −0.625 volts and +0.039 volts at the negative reference voltage input of 6 bit flash encoder 27. Resistors 28 and 29 are laser trimmed to produce the voltage needed on conductor 30 so that the digital outputs of 6 bit flash encoder 21 and 6 bit flash encoder 22 produce the proper digital outputs, including a +0.039 volt error, when +0.625 volts, −0.625 volts, and 0 volts are applied to the input 20 thereof.

Resistors 57, 58, 59, 60, 82 and 83 of LSB flash encoder 48 are adjusted so that correct digital outputs of LSB flash encoder are obtained when +0.625 volts, 0 volts, and −0.625 volts are applied to the conductor 46. This results in operational amplifier 53 applying about +0.625 volts to the positive reference input of flash encoder 51 and operational amplifier 55 applying about −0.625 volts to the minus reference input of flash encoder 52. The reason for these adjustments will be explained later.

Now that the basic structure shown in FIG. 1 has been explained, and the most significant waveforms occuring therein have been shown in FIG. 2, the overall operation of analog-to-digital converter 1 will be described. The analog input signal 2 is initially provided as an input to sample and hold circuit 3, which produces the sampled signal on conductor 15 within 33 nanoseconds. Use of the sample and hold circuit, rather than applying the analog input directly to conductor 15, reduces the aperture jitter of the ADC 1 to about 25 picoseconds. The diode bridge switching circuit 5 is used to implement the needed sampling switch because it appears to offer the best solution to the conflicting requirements of extremely high accuracy and extremely high speed required to achieve the 10 megahertz conversion rate of ADC 1. By providing the previously described extremely high accuracy, high speed, highly stable operational amplifier 2, trimming of resistors 13 and 14 to provide a gain of exactly 1, a very low output impedance of about 0.25 ohms is accomplished for operational amplifier 2, enabling it to drive the feed forward 200 ohm resistor 37 and the MSB flash encoder input resistor network 18, 19 with a low combined resistance of about 100 ohms, with negligible inaccuracy due to the loading on operational amplifier 2.

Due to the fact that the sampling capacitor 6 is not in the amplifier feedback path, the closed loop output amplifier 2 need settle only to within 7 bit accuracy before the MSB flash encoder is strobed. As long as the closed loop output amplifier 2 settles to within 12 bit accuracy by the time the LSB flash encoder 48 is strobed, the digital correction circuitry 61 is capable of correcting the extended settling error. Therefore, an additional 60 nanoseconds can be tolerated to allow the closed loop amplifier 2 to settle within 12 bit accuracy. In a similar fashion, affects of current leakage of sampling capacitor 6 will create only offset error that is correctable by the digital error correction circuitry 61, but will not introduce a linearity error.

After the initial "acquisition time" or analog input sampling time of 33 nanoseconds has elapsed, an additional 18 nanoseconds is allowed to elapse before the MSB flash encoder 17 is strobed by MSB Strobe signal 77. MSB flash encoder 17 establishes the 7 most significant bits to the input of the 12 bit adder 71; in other words, the MSB flash encoder 17 determines the initial "course" approximation of the input signal. The described two 6 bit flash encoders 21 and 22 were utilized to provide the needed resolution, accuracy and range to accomplish satisfactory "assembly" of the final 12 bit digital output word.

As previously described, the initial "course" approximation to the sampled analog input signal 15 is converted back to a very accurate analog signal that is subtracted from the fed forward sampled digital analog input signal. As shown in FIG. 3, the 7 bit DAC is ECL (emitter coupled logic) compatible and achieves 14 bit accuracy, with a settling time of 25 nanoseconds. The switching of the MOSFET gating switch circuitry 39, 40 in response to the Amplifier Enable signal 76 is to prevent the wide band amplifier 43 from overloading during the time when the sample and hold circuit 3 is processing a new analog signal and the MSB flash encoder 17 is still holding data from the previous sample. In accordance with the present invention, isolation of the input of wide band amplifier 43 from the subtraction node 38 until (1) the conversion by DAC 36 is complete, and (2) the data acquisition by sample and hold circuit 3 is complete, provides two substantial advantages. The first advantage is that the sampled voltage on conductor 15 is fed forward directly, with no distortion or delay, to subtraction node 38, and therefore is as precisely accurate as the sampled analog signal 15 itself. The second advantage is that only the residue voltage is ever applied to the input of wide band amplifier 43, so that wide band amplifier 43 never gets overdriven, and consequently, never saturates. This avoids the need to add additional settling time to the conversion process that would otherwise be required to allow wide band amplifier 43 to recover from a worst case overdriven condition.

The residue signal, after being multiplied by a gain of 16 by wide band amplifier 43, is applied to the analog input of LSB flash encoder 48, which is identical to MSB encoder 17, in order to improve the manufacturability of the device, except that the resistive input network 18, 19 of MSB flash encoder 17 is not used for LSB encoder. This is done so that the same reference voltage can be used without having to double the gain of amplifier 43. Operating amplifier 43 at the lower gain that then is permissible allows amplifier 43 to have greater bandwidth, and hence allows it to have a low settling time of 25 nanoseconds. This is important in achieving the low overall conversion time of ADC 1. After the data in each of the MSB and LSB encoders has been latched into the 14 bit latch 65 of the digital error correcting circuit 61, the two 7 bit MSB and LSB words, with the 2 middle bits of each "overlapping", assembles the final 12 bit word.

The timing circuit 75 provides the timing signals in accordance with the waveforms shown in FIG. 2. More specifically, the conversion process is initiated by bringing the Convert Command 78 to a high level. At the same time, the Sample/Hold Strobe signal 16 is brought to a high level to place sample and hold circuit 3 in a "hold" mode. After a delay of 18 nanoseconds, to allow settling of the sample and hold circuit, an 8 nanosecond pulse 85 of MSB strobe pulse 77 is produced to strobe the sampled voltage 15 into the MSB flash encoder 17. A delay of 22 nanoseconds is allowed for the latched data to become available to drive 7 bit DAC 36. At about the same time that the new digital data is presented to the inputs of DAC 36, Amplifier Enable signal 76 permits the wide band amplifier 43 to be switched into its active mode. When the output of amplifier 43 has settled, another 8 nanosecond strobe pulse 86 is generated on conductor 73 to latch the output of the LSB flash encoder 48 and to transfer the LSB word on conductor 56 into 14 bit latch 65. As soon as both the MSB data 23 and the LSB data 56 are stored in digital form in 14 bit latch 65, the sample and hold circuit 3 is placed back in the sample mode. The pulse on conductor 67 is derived from the LSB encoder strobe pulse 73 and delayed 30 nanoseconds to load 14 bit latch 65. The final Data Valid pulse 74 then is generated to indicate that the data on bus 72, constituting the 12 bit digital output word representative of the sampled analog input signal, is stable.

As mentioned above, and in accordance with the present invention, one of the unique features of the sample and hold circuit is the use of the closed loop, high input impedance field effect transistor operational amplifier to buffer the sampling capacitor 6. There are several benefits that result from the use of a closed loop feedback amplifier compared to the conventional use of an open loop buffer.

It should be realized, however, that the benefits have not been heretofore achieved because of the unavailability of a sufficiently highly accurate, highly stable, high speed operational amplifier. A significant advantage of the use of a closed loop operational amplifier is that the output impedance is only about 0.25 ohms, compared to the more typical 5 ohm output impedance of an open loop buffer. This low output impedance simplifies the interface between the sample and hold circuit and the conductor 15, which is loaded by the feed forward resistive network and the gain reducing resistive network connected to the input of MSB flash encoder 17. The fact that the sample and hold circuitry then can drive low impedances without introducing significant error results in reduced settling times, and hence in more rapid overall conversion times. Another benefit of using a closed loop amplifier is that the gain of the operational amplifier 2 is easily laser trimmable to produce a gain of exactly 1, which gain is stable over a wide temperature range. This avoids the need to provide potentiometers to adjust gain of the sample and hold circuit, as is the case with prior art sample and hold circuits, such as the HTS-0010 track-and-hold circuit made by Analog Devices Corporation. Prior approaches of adjusting the gain of open loop buffers frequently require resistances to be provided in the signal path. This degrades bandwidth, and furthermore, may cause gain adjustments that are accurate at one temperature to be inaccurate at another temperature; whereas, for the new operational amplifier described herein, a single gain adjustment, by laser trimming during the manufacturing process, provides accurate gain over the entire ordinary operating temperature range.

As previously mentioned, resistors 26, 27, 28, 29, 32, and 33 are laser trimmed during the manufacturing operation to add 39 millivolts to the outputs of each of operational amplifiers 25 and 31 and to conductor 30. The 39 millivolt amount is selected on the basis of the determination of the maximum possible positive error likely to be produced in MSB flash encoder 17, and a determination of the maximum negative error likely to be produced by MSB flash encoder 17; the two are added together. Addition of this total error voltage to both of the positive and negative reference inputs of MSB flash encoder 17 forces any error that is likely to be introduced by MSB flash encoder 17 to be in a positive error voltage range which will be represented by a positive digital quantity, which then can be corrected by digital error correction circuitry 61 without its having to process negative digital numbers, which would add considerably to the complexity of digital error correcting circuitry 61.

The problem in dealing with digital error correcting of errors that might fall in either a positive or negative voltage range is a problem generally faced in the design of subranging analog-to-digital converters. To my knowledge, the problem has not been solved in the manner that I have proposed above.

My analysis of the subranging ADC 1 of FIG. 1 shows that the digital output word 72 contains only two error terms, namely, the error introduced by digital-to-analog converter 36, and the error introduced by LSB encoder 48. Errors introduced in MSB flash encoder 17 do not appear in the final output, nor do small sampling errors or errors due to leakage of the sampling capacitor 6, as long as the closed loop amplifier of the sample and hold circuit settles to within 12 bit accuracy by the time that the LSB Strobe Pulse is produced on conductor 73. This is deemed to be a surprising result, that led to simplification of the digital error correcting circuitry by deliberate introduction of error into the MSB flash encoder 17, which, in turn, simplifies the digital error correcting circuitry without adding any inaccuracy at all to the final 12 bit digital word produced by the ADC 1.

In order to understand how the 7 bit MSB word and the "overlapping" LSB 7 bit word are combined or added together to produce an accurate 12 bit digital output 72, it is helpful to recognize that the MSB flash encoder can be of any desired accuracy and resolution. In the presently described embodiment of the invention, the 7 bit MSB word can be considered to be the 7 most significant bits of a 12 bit word in which the 5 least significant bits are all zeros, or "implied zeros". Similarly, the LSB flash encoder can be of any desired resolution. In the present example, the 7 bit conversion of the accurate amplified residue or difference voltage is selected to be 7 bits, and can be considered to be the 7 least significant bits of a 12 bit word in which the most significant 5 bits are all "zeros", or "implied zeros". Then. all that adder 71 of digital error correcting circuit 61 needs to do is simply add these two 12 bits words together to obtain the final accurate, corrected 12 bit digital word 72. If digital correction were not used, the overall accuracy would be no better than that of the MSB flash encoder, as no means for correcting the error would exist. With digital error correction circuitry, the error generated in the MSB encoder is encoded by the LSB encoder with a phase inversion, due to the signal being processed by the 7 bit DAC 36. The adder 71 cancels the error as the same error signal is summed with both inverted and non-inverted phases.

As mentioned above, 7 bit DAC 7 has 14 bit accuracy. Ordinarily, most commercially available DACs have approximately the same accuracy as resolution. However, those used in subranging analog-to-digital converters need much higher accuracy than resolution. A commercially available DAC that would be suitable is the above-mentioned Burr-Brown Corporation DAC63. 7 bit DAC 36, as used in the presently preferred embodiment of the invention, is somewhat different than the Burr-Brown DAC63 and therefore is shown in relevant detail in FIG. 3, for the purpose of completing the disclosure and enabling those skilled the art to practice the invention without undue experimentation. In FIG. 3, the DAC/amplifier module designated by reference numeral 47 includes the 10 volt reference voltage circuit 35, which includes an operational amplifier, a zener diode, and a pair of emitter follower outputs, one of which supplies a 1.5 milliampere reference current to a control amplifier 88 of 7 bit DAC 36. The amplifier enable inverter is an emitter coupled logic stage having one input connected to Amplifier Enable conductor 76 and a −1.3 volt reference voltage applied to the other input. The two inverting and non-inverting outputs are connected to the gate electrodes of MOSFETs 39 and 40, respectively. The configuration of wide band amplifier 43 is shown for completeness, but the circuitry could be implemented easily in various other ways by those skilled in the art, so a detailed description is not deemed necessary. Similarly, the precise circuitry of 7 bit DAC, with 14 bit accuracy, is shown in FIG. 3, but the DAC configuration is straightforward, and need not be described in detail to those skilled in the art. The 14 bit accuracy is achieved by simply providing proper precision in the resistors and precise matching and scaling of the various transistors.

Referring now to FIG. 4, sample and hold circuit 3 includes a high gain, high bandwidth, highly stable operational amplifier 2, the implementation of which makes possible the previously mentioned highly desirable use of a closed loop operational amplifier to buffer sampling capacitor 6 of sample and hold circuit 3.

Input buffer 4 can be an HA5033, by Harris Semiconductor Co. The output of input buffer 4 is connected by conductor 6 to one node of diode switching bridge 5, which contains hot carrier diodes 5A and 5B having their cathode and anode respectively connected to conductor 6. Bridge 5 includes conductor 11 connected to the anode of hot carrier diode 5A and the anode of hot carrier diode 5C. The output of diode switching bridge 5 is produced on conductor 7, which is connected to sampling capacitor 6, to the cathode of diode 5C, and to the anode of hot carrier diode 5D. Conductor 9 is connected to the cathodes of diodes 5B and 5D.

Sample and hold command 16 is applied to the input of a buffer circuit 8 that produces an inverting output on conductor 9A and a non-inverting output on conductor 11A. The signal on conductor 11A is shifted up by means of a network including zener diode 210, and resistors 211 and 212 to the base of a PNP transistor 217. The signal on conductor 9A is similarly shifted up by zener diode 213 and resistors 214 and 215 to the base of PNP transistor 216, which is connected in a common emitter arrangement with transistor 217 to current source transistor 223. The collectors of transistors 216 and 217 are connected to conductors 9 and 11, respectively, of switching diode bridge 5. Conductor 11 is also connected by diode 218 and resistor 219 to sample and hold output conductor 15. Conductor 9 is connected by diode 221 and resistor 220 to sample and hold output conductor 15.

The signal on conductor 11A is shifted down by zener diode 204 resistors 205 and 206 to the base of NPN transistor 201, which has its emitter connected to the emitter of NPN transistor 202 and to constant current source 203. Similarly, the signal on conductor 9A is level shifted downward by zener diode 207 and resistors 208 and 209 to the base of NPN transistor 202.

The basic operation of diode switching bridge 5 and its above-described associated circuitry in response to sample and hold command 16 is readily apparent to those skilled in the art and therefore will not be set forth in detail.

Referring now to the operational amplifier 2, and in accordance with a further important aspect of the present invention, operational amplifier 2 includes an N channel junction field effect transistor (JFET) 225 having its drain connected to +15 volt conductor 277 and its gate connected to conductor 7, on which the output of switching diode bridge 5 is produced. The source of JFET 225 is connected by conductor 228 to resistors 229 and 231. Similarly, the drain of N channel junction JFET 236 is connected to +15 volt conductor 277; its source is connected by conductor 227 to resistors 230 and 232.

The other terminals of resistors 229, 230, 231, and 232 are connected, respectively, to the emitters of PNP transistors 233, 234, 235, and 236. The bases of PNP transistors 233 and 234 are both connected to the collector of PNP transistor 234. The collector of PNP transistor 233 is connected by means of conductor 251 to the collector of NPN transistor 237 and the base of differential amplifier NPN transistor 259. The collector of PNP transistor 234 is connected to the collector of NPN transistor 238.

The bases of PNP transistors 235 and 236 are both connected to the collector of PNP transistor 235 and to the collector of NPN transistor 240. The collector of PNP transistor 236 is connected to the collector of NPN transistor 241. The bases of NPN transistors 237 and 241 are connected to the collector of NPN transistor 242 and to the emitters of differential amplifier NPN transistors 259 and 260 by means of cnductor 261 and conductor 279.

The bases of NPN transistors 238, 240, and 242 are connected by conductor 239 to the collector and base of NPN transistor 257 and to one terminal of resistor 253. The other terminal of resistor 253 is connected by conductor 254 to the cathode of zener diode 256 and to one terminal of resistor 252, the other terminal of which is connected to a +5 volt conductor 275. The anode of zener diode 256 is connected to −5 volt conductor 276. The emitters of NPN transistor 257, 237, 238, 240, 241, and 242 are respectively coupled to −5 volt conductor 276 by resistors 258, 243, 244, 245, 246, and 247, respectively.

The collector of differential amplifier transistor 259 is connected to the collector of PNP transistor 262 and to the bases of PNP transistors 262 and 263. The emitters of PNP transistors 262 and 263 are connected by resistors 264 and 265 to +5 volt conductor 278. The collector of differential amplifier transistor 260 is connected by conductor 267 to the emitter of NPN transistor 266 and to the base of PNP transistor 273, the collector of which is connected to −5 volt conductor 276. The base of NPN transistor 266 is connected to the junction between resistors 268 and 269. The opposite terminal of resistor 268 is connected to conductor 267. The opposite terminal of resistor 269 is connected to the collector of NPN transistor 266 and to the base of NPN transistor 270. The collector of NPN transistor 266 is also connected to the collector of PNP transistor 263. The collector of NPN transistor 270 is connected to +5 volt conductor 278. The emitter of NPN transistor 270 is connected by resistor 271 to sample and hold output conductor 15. The emitter of PNP transistor 273 is connected by resistor 272 to sample and hold output conductor 15.

Exemplary values for the resistors of operational amplifier 2 are indicated in Table 1.

TABLE 1

| RESISTOR NO. | RESISTANCE (ohms) |
| --- | --- |
| 13 | 2000 |
| 14 | 10 |
| 229 | 16 |
| 230 | 16 |
| 231 | 16 |
| 232 | 16 |
| 243 | 195 |
| 244 | 195 |
| 245 | 195 |
| 246 | 195 |
| 247 | 50 |
| 252 | 600 |
| 253 | 600 |
| 258 | 100 |
| 264 | 100 |
| 265 | 100 |
| 268 | 330 |

TABLE 1-continued

| RESISTOR NO. | RESISTANCE (ohms) |
| --- | --- |
| 269 | 330 |

The operation of the amplifier 2 is described next. Initially, the bias circuit including zener diode 256, transistor 257 and resistors 252, 253, and 258 produces a bias voltage on NPN transistors 238, 240, and 242, forcing them to produce currents I1, I2, and I3. The transistors and emitter resistors are matched, so that I1 and I2 are equal. I3 is suitably scaled with respect to I1 and I2 to properly bias the differential amplifier including NPN transistors 259 and 260. Those skilled in the art will recognize that the foregoing circuitry including transistors 238, 240, and 242 "mirrors" the current flowing through NPN transistor 257.

The current I1 in NPN transistor 238 flows through diode-connected PNP transistor 234. Assuming that the N-channel JFETS 225 and 226 are matched, and assuming that the voltage on sample and hold output conductor 7 is the same as the voltage on feedback conductor 274, and that PNP transistors 233 and 234 and resistors 229 and 230 are matched, PNP transistors 233 and 234 and their respective emitter resistors constitute a PNP current mirror circuit, so that I4 is produced in response to and is equal to I1. Similarly, I2 is mirrored by PNP transistors 235 and 236 to produce I5, which is equal to I2. The combination of I3 being produced in the differential amplifier 259, 260, the common mode feedback from conductor 261 to the bases of NPN transistors 237 and 241, and the feedback of sample and hold output conductor 15 to the gate electrode of JFET 226 results in "operating points" being established for conductors 261 and 279 to translate the input signal 7 and the feedback signal through resistor 14 to the gate electrodes of JFETs 225 and 226, respectively, to the base electrodes of NPN transistors 259 and 260, respectively.

The above-described operational amplifier 2 has been found to provide the combination of high performance characteristics needed for closed loop amplifier in sample and hold circuit 3 to buffer the switching diode bridge 5 and the sampling capacitor 6 from the sample and hold output 15. Those skilled in the art will readily recognize that extremely high accuracy is required for a closed loop operational amplifier that is to be used in a sample and hold circuit, the output of which must provide an input to an analog-to-digital converter having 12 bit accuracy. High input impedance is accomplished by using JFETs 225 and 226 as input devices. The cross coupling from the respective sources of JFETs 225 and 226, each of which acts as a source follower, to the PNP current mirror circuits establishing the bias currents in the opposite JFET source follower circuits, by means of resistors 231 and 230, results in effectively doubling the gain of operational amplifier 2 over what it would be if the cross coupling resistors 230, 231 are omitted.

It can be readily seen that the biasing and level shifting circuitry connected between the JFET source follower and the base of NPN differential amplifier input transistors 259 and 260 is completely symmetrical, so that very low DC offset is achieved over a wide temperature range. Effective level shifting between N-channel JFETs 225 and 226 and the bases of NPN differential amplifier transistors 259 and 260 is achieved. Very high gain and high bandwidth are achieved by use of NPN transistors 259 and 260 in the differential amplifier stage.

The fact that only one NPN differential amplifier stage is required to achieve adequate gain, when combined with the gain of the JFET input stage, results in the needed high bandwidth, at low cost.

To provide a better understanding of the foregoing general statements as to the operation and advantages, a more specific and detailed description of the operation of the amplifier will now be given.

An "intuitive" way of understanding the operation of the operational amplifier 2 is to consider the circuitry composed of JFET 225, resistor 229, PNP transistor 233, and constant current source transistor 237 to be a first source follower circuit, and to consider JFET 226, resistor 232, PNP transistor 236, and constant current source transistor 241 to constitute a second source follower circuit. Note that for small voltage swings, the voltage drop between the gate of JFET 225 and emitter of PNP transistor 233 will be constant, and the voltage drop between the gate of JFET 226 and the base of PNP transistor 233 will be constant, since the currents I4 and I5 are constant. Similarly, the voltage drop between the gate of JFET 226 and the emitter of PNP transistor 236 will be constant, as will the voltage drop between the gate of JFET 226 and the base of PNP transistor 236.

Next, note that an "object" of the operational amplifier 2 is to make the output voltage on conductor 15, which is fed back by resistor 14 to the gate of JFET 226, equal to the voltage on the gate of JFET 225. However, if the voltage on the gates of JFET 225 is slightly greater than on the gates of JFET 226, the voltage difference will appear as an increase in the emitter-to-base voltage of PNP transistor 233, tending to increase I4 and thereby increase the voltage on conductor 261. This increases the base voltage of and the current through NPN transistor 259, decreasing the current through and the voltage of the collector of NPN transistor 260, reducing the output voltage on conductor 15 and on the gate of JFET 226, reducing the above-mentioned voltage difference.

Simultaneously, and in an entirely similar fashion, the same above-mentioned voltage difference between the gate of JFETs 225 and 226 will appear as a decrease, rather than an increase, in the emitter-to-base voltage of PNP transistor 236. This will tend to decrease I5 at the same time I4 is being increased, and therefore decreases the voltage of conductor 279 and the base of NPN transistor 260 at the same time the base of NPN transistor 259 is being increased.

It can be shown that the isolation between the sources of JFETs 225 and 226 achieved by the above-described cross-coupling source follower arrangements results in an effective transconductance gm, and hence in a gain, that is about twice as great as would be achieved by a more conventional common source differential amplifier circuit to translate the gate voltage of JFETs 225 and 226 to the bases of NPN transistors 259 and 260. The entirely balanced structure has the further advantage of providing very low input offset voltages and very low thermal drift thereof.

The above-described subranging analog-to-digital converter 1 provides the advantages of avoiding the inaccuracies due to delay circuits that feed the sampled analog signal forward to the subtraction node in the prior art subranging ADCs, and thereby improves the overall accuracy and linearity of the present subranging analog-to-digital converter. The use of the MOSFET isolation switches are what makes possible the described direct feed forward of the sampled analog signal to the subtraction node, and hence the elimination of of error due to the feed forward delay elements.

The superimposing of the described (39 millivolt) error voltage to the reference voltage inputs of the MSB flash encoder does not affect the accuracy or linearity of the subranging analog-to-digital converter, yet provides the advantage of simplification of the error correcting circuitry, by avoiding the need to operate on negative binary numbers.

Utilization of the closed loop amplifier in the sample and hold circuit results in very high accuracy of the sample and hold circuit, without the need for external potentiometers. Finally, the novel design of the operational amplifier used in the sample and hold circuit provides a previously unobtainable combination of high bandwidth and low offset over the normal operating temperature range, thereby making it possible to utilize the closed loop amplifier in the sample and hold circuit, and providing the further advantage of very low output impedances than can drive the MSB flash encoder and the subtraction node without introducing significant error.

While the invention has been described with reference to a particular embodiment thereof, those skilled in the art will be able to make various changes in the described embodiment of the invention without departing from the true spirit and scope thereof. It is intended that all devices that are equivalent to the described embodiment of the invention in that they contain elements that perform substantially the same function in substantially the same way to achieve the substantially the same result are to be considered with the scope of the present invention. For example, it would be possible for the MSB flash encoder to have fewer bits and for the LSB flash encoder to have correspondingly more bits, or vice versa, and achieve comparable results. Other balanced level shifting and cross-coupling than disclosed in FIG. 4 might achieve the desired balanced interfacing between the N-channel JFETs and the emitter coupled NPN transistor pair of the differential amplifier stage of the operational amplifier of FIG. 4. The technique shown in FIG. 1 for extending the resolution of flash encoders by connecting their outputs in parallel and cascoding their voltage reference inputs, and adjusting the various reference voltage inputs by laser trimming resistors such as 26, 27, 28, 29, 32, and 33 can be useful in applications other than subranging analog-to-digital converters.

I claim:

1. A high gain, low offset operational amplifier having first and second inputs, one being an inverting input and the other being a non-inverting input, an output, and feedback means coupled between the output and the inverting input, the operational amplifier comprising in combination:
   (a) a first source follower circuit including
      (1) a first N-channel JFET having its gate electrode coupled to the first input,
      (2) a first source load circuit including a first resistor coupled between the source of the first JFET and the emitter of a first PNP transistor having its collector coupled to the collector of a first NPN constant current source transistor;
   (b) a second source follower circuit including
      (1) a second N-channel JFET having its gate electrode coupled to the second input, (2) a second source load circuit including a second resistor coupled between the source of the second JFET and the emitter of a second PNP transistor having its collector coupled to the collector of a second NPN constant current source transistor;

(c) first cross-coupling means for coupling the source of the first JFET to the base of the second PNP transistor to vary the voltage of the base of the second PNP transistor in direct relationship to the voltage of the first input and thereby vary the collector voltage of the second PNP transistor in amplified relationship to the difference between the first and second inputs;

(d) second cross-coupling means for coupling the source of the second JFET to the base of the first PNP transistor to vary the voltage of the base of the first PNP transistor in direct relationship to the voltage of the second input the thereby vary the collector voltage of the first PNP transistor in amplified relationship to the voltage difference between the first and second inputs;

(e) a differential amplifier stage including first and second NPN transistors having their emitters commonly coupled to a first constant current source, their base coupled to the collectors of the first and second PNP transistors, respectively, and an output driver coupling the collector of one of the first and second NPN transistors to the output of the operational amplifier; and (f) first biasing means coupled between the emitters of the first and second NPN transistors and the bases of the first and second NPN constant current source transistors for biasing the first and second NPN constant current source transistors so that their collector voltages have predetermined operating points relative to their base voltages, respectively.

2. The high gain, low offset operational amplifier of claim 1 wherein the first cross-coupling means includes a third PNP transistor having its base and collector coupled to the base of the second PNP transistor and to a second constant current source and having its emitter coupled by a third resistor to the source of the first JFET, and wherein the second cross-coupling means includes a fourth PNP transistor having its base and collector coupled to the base of the first PNP transistor and to a third constant current source and having its emitter coupled by a fourth resistor to the source of the second JFET.

3. The high gain, low offset operational amplifier of claim 2 wherein the first, second, and third constant current sources each include a respective NPN current mirror transistor biased by a common current mirror biasing circuit.

4. The high gain, low offset operational amplifier of claim 3, wherein the constant currents produced by the first and second NPN constant current source transistors and the second and third constant current sources are equal.

5. A method of operating an operational amplifier to achieve high gain and stable, low input offset voltage, the method comprising the steps of:

(a) applying a first input voltage to the gate of a first field effect transistor and applying a second input voltage that is fed back from an output of the operational amplifier to the gate of a second field effect transistor;

(b) shifting the level of the source voltage of the first field effect transistor to a first input of a first buffering circuit that has a second input and a high impedance output, and shifting the level of the source voltage of the second field effect transistor to the second input of the first buffering circuit, to cause the output of the first buffering circuit to undergo a first voltage change that has a predetermined relationship to the difference between the voltages of the sources of the first and second input voltages;

(c) shifting the level of the source voltage of the second field effect transistor to a first input of a second buffering circuit that has a second input and a high impedance output, and shifting the level of the source voltage of the first field effect transistor to the second input of the second buffering circuit, to cause the output of the second buffering circuit to undergo a second voltage change that has a predetermined relationship to the difference between the voltage of the sources of the first and second input voltages;

(d) providing a first NPN constant current source transistor with its collector coupled to the high impedance output of the first buffering circuit, and a second NPN constant current source transistor with its collector coupled to the first high impedance output of the second buffering circuit;

(e) applying the first and second voltage changes to the bases of first and second emitter-coupled transistors in a differential amplifier stage, an output of which is coupled to the output of the operational amplifier; and (f) biasing the bases of the first and second NPN constant current source transistors by coupling the voltage of the common emitters of the first and second emitter-coupled transistors to the bases of the first and second NPN constant current source transistors so that their collector voltages each have predetermined operating points relative to their base voltages, respectively.

6. The method of claim 5 wherein step (b) includes shifting the level of the source voltage of the first field effect transistor by causing a first constant current to flow through a first resistor having one of its terminals connected to the emitter of the first field effect transistor and having its opposite terminal connected to the first input of the first buffering circuit, and wherein step (b) also includes shifting the level of the source voltage of the second field effect transistor by causing a second constant current to flow through a second resistor having one of its terminals connected to the source of the second field effect transistor and having its opposite terminal connected to the second input of the first buffering circuit, and wherein step (c) is performed entirely similarly to and essentially simultaneously with step (b).

* * * * *